US012764922B2

(12) United States Patent
Chiu et al.

(10) Patent No.: US 12,764,922 B2
(45) Date of Patent: Oct. 13, 2026

(54) SEMICONDUCTOR STRUCTURE

(71) Applicant: Powerchip Semiconductor Manufacturing Corporation, Hsinchu (TW)

(72) Inventors: Jih-Chao Chiu, Hsinchu (TW); Yu-Shan Wu, Hsinchu (TW); Yuan-Ming Liu, Hsinchu (TW); Chee-Wee Liu, Taipei City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 373 days.

(21) Appl. No.: 18/664,305

(22) Filed: May 15, 2024

(65) Prior Publication Data

US 2025/0331153 A1 Oct. 23, 2025

(30) Foreign Application Priority Data

Apr. 18, 2024 (TW) ................................ 113114475

(51) Int. Cl.
*H10B 12/00* (2023.01)

(52) U.S. Cl.
CPC .................................... *H10B 12/00* (2023.02)

(58) Field of Classification Search
CPC ...................................................... H10B 12/00
See application file for complete search history.

(56) References Cited

U.S. PATENT DOCUMENTS

2020/0006350 A1 1/2020 Zhang
2021/0082766 A1 3/2021 Miura et al.
2022/0415923 A1* 12/2022 Wu ........................ H10B 51/20
2023/0100058 A1* 3/2023 Yu ........................ H10D 30/014 257/347
2023/0262988 A1* 8/2023 Harari ................... G11C 11/223 257/295
2023/0397392 A1 12/2023 Kaeding et al.
2024/0251564 A1* 7/2024 Wang ..................... H10B 51/20

FOREIGN PATENT DOCUMENTS

TW 202127663 7/2021

OTHER PUBLICATIONS

"Office Action of Taiwan Counterpart Application", issued on Nov. 8, 2024, p. 1-p. 7.

* cited by examiner

*Primary Examiner* — Mohsen Ahmadi
(74) *Attorney, Agent, or Firm* — JCIPRNET

(57) ABSTRACT

A semiconductor structure including a substrate, gate layers, channel layers, and gate dielectric layers is provided. The gate layers and the channel layers are stacked on the substrate. The gate layers are separated from each other. Each of the gate layers surrounds the corresponding channel layer. Two adjacent gate layers are located between two adjacent channel layers. The gate dielectric layers are located between the gate layers and the channel layers.

16 Claims, 4 Drawing Sheets

SEMICONDUCTOR STRUCTURE

CROSS-REFERENCE TO RELATED APPLICATION

This application claims the priority benefit of Taiwan application serial no. 113114475, filed on Apr. 18, 2024. The entirety of the above-mentioned patent application is hereby incorporated by reference herein and made a part of specification.

BACKGROUND

Technical Field

The invention relates to a semiconductor structure, and particularly relates to a semiconductor structure including a gate-all-around (GAA) device.

Description of Related Art

With the advancement of the semiconductor technology, the semiconductor industry continues to reduce the size of semiconductor device (e.g., transistor device). In this way, the footprint of the device can be reduced, thereby increasing the device density of the semiconductor device. However, how to further increase the device density of the semiconductor device is the goal of continuous efforts.

SUMMARY

The invention provides a semiconductor structure, which can effectively increase the device density of the semiconductor device.

The invention provides a semiconductor structure, which includes a substrate, gate layers, channel layers, and gate dielectric layers is provided. The gate layers and the channel layers are stacked on the substrate. The gate layers are separated from each other. Each of the gate layers surrounds the corresponding channel layer. Two adjacent gate layers are located between two adjacent channel layers. The gate dielectric layers are located between the gate layers and the channel layers.

According to an embodiment of the invention, in the semiconductor structure, the substrate may be a silicon substrate or a glass substrate.

According to an embodiment of the invention, in the semiconductor structure, the materials of the gate layers may include TiN, Al, Ti, Pd, Cr, Cu, Mo, or combinations thereof.

According to an embodiment of the invention, in the semiconductor structure, the materials of the channel layers may include oxide semiconductor materials or semiconductor materials.

According to an embodiment of the invention, in the semiconductor structure, the oxide semiconductor materials may include InGaZnO (IGZO), InSnO, $In_2O_3$, InZnO, ZnO, GaO, ZnInSnO, or ZnSnO.

According to an embodiment of the invention, in the semiconductor structure, the semiconductor materials may include Si, Ge, SiGe, GeSn, GaAs, GaSe, SiC, GaN, InP, AlGaAs, InGaP, or ZnSe.

According to an embodiment of the invention, in the semiconductor structure, a portion of the lowermost gate layer may be located between the substrate and the lowermost channel layer.

According to an embodiment of the invention, in the semiconductor structure, a portion of the lowermost gate dielectric layer may be located between the substrate and the lowermost channel layer.

According to an embodiment of the invention, in the semiconductor structure, the materials of the gate dielectric layers may include high dielectric constant (high-k) dielectric materials.

According to an embodiment of the invention, in the semiconductor structure, the high-k dielectric materials may include $Al_2O_3$, $HfO_2$, $TiO_2$, $ZrO_2$, $La_2O_3$, $Y_2O_3$, $Ta_2O_5$, or $HfSiO_4$.

According to an embodiment of the invention, the semiconductor structure may further include transistor devices. The transistor devices may include the gate layers, the channel layers, and the gate dielectric layers.

According to an embodiment of the invention, in the semiconductor structure, at least two of the transistor devices may be connected in parallel.

According to an embodiment of the invention, the semiconductor structure may further include first doped regions and second doped regions. The first doped regions and the second doped regions are located in the channel layers. The first doped regions and the second doped regions may be located on opposite sides of the gate layers.

According to an embodiment of the invention, in the semiconductor structure, the transistor devices may further include the first doped regions and the second doped regions.

According to an embodiment of the invention, in the semiconductor structure, the transistor devices may include a write transistor device and a read transistor device.

According to an embodiment of the invention, in the semiconductor structure, the write transistor may include at least two of the transistor devices connected in parallel.

According to an embodiment of the invention, in the semiconductor structure, the first doped region of the write transistor may be electrically connected to the gate layer of the read transistor.

According to an embodiment of the invention, the semiconductor structure may further include sacrificial layers. The sacrificial layers are located aside the gate layers. The sacrificial layers are located between the channel layers.

According to an embodiment of the invention, the semiconductor structure may further include dielectric layers. The dielectric layers are located on the gate layers.

According to an embodiment of the invention, in the semiconductor structure, a portion of the lowermost dielectric layer may be located in a portion of the lowermost gate layer.

Based on the above description, in the semiconductor structure according to the invention, the gate layers and the channel layers are stacked on the substrate, the gate layers are separated from each other, each of the gate layers surrounds the corresponding channel layer, and two adjacent gate layers are located between two adjacent channel layers. Therefore, the semiconductor structure according to the invention can effectively increase the device density of the semiconductor device (e.g., transistor device).

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 1:
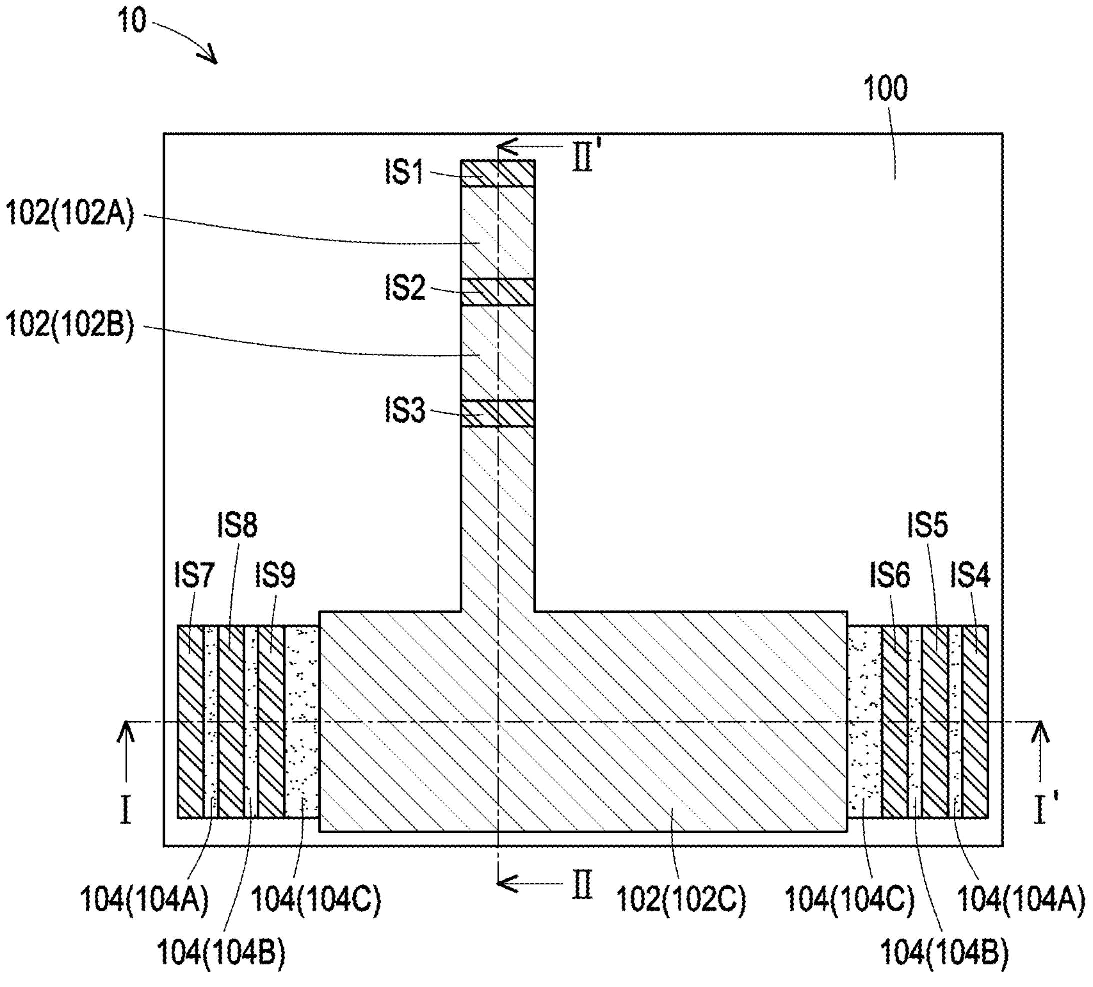
FIG. 1 is a top view of a semiconductor structure according to some embodiments of the invention.
Figure 2:
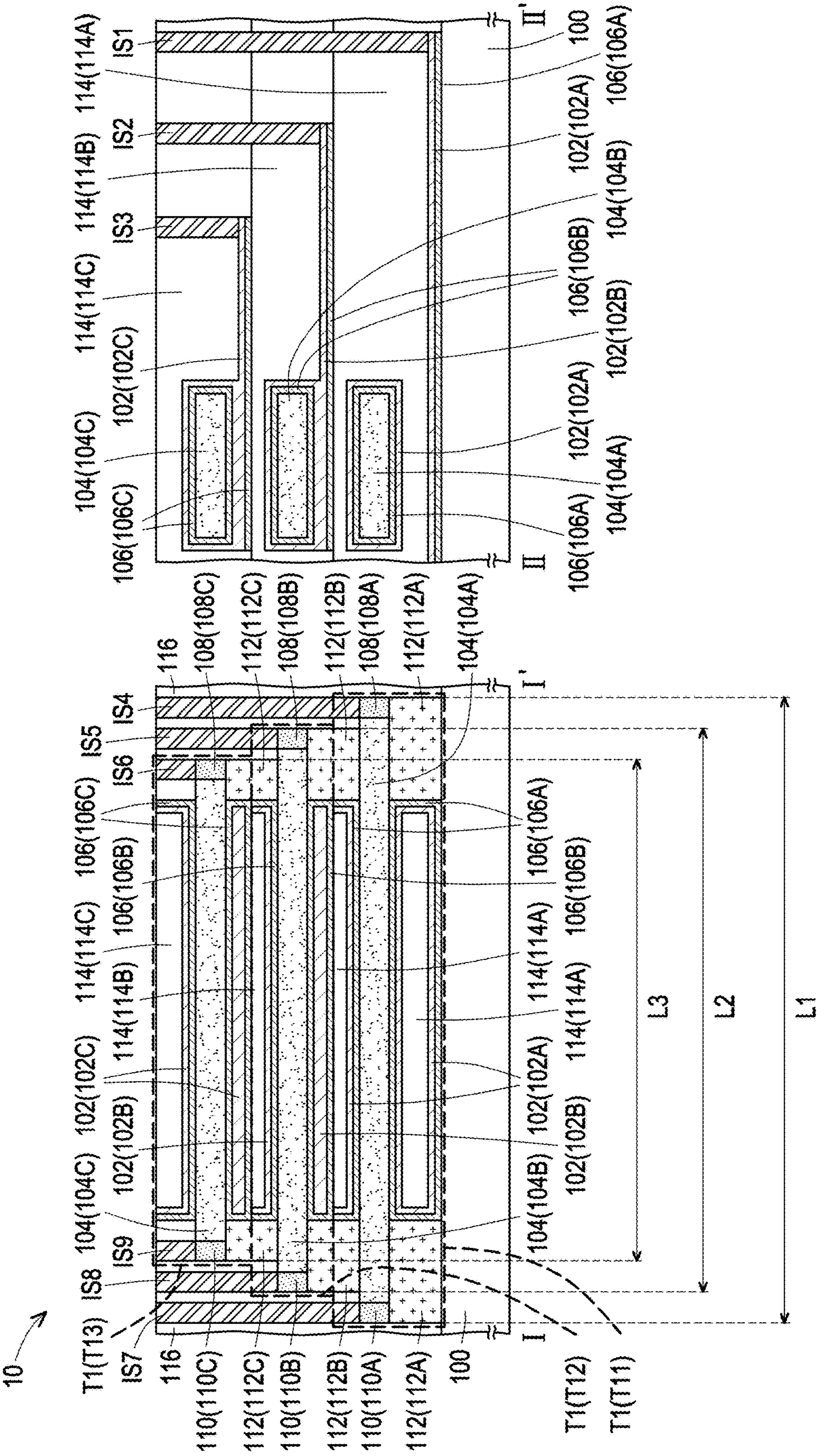
FIG. 2 is a cross-sectional view of a semiconductor structure taken along section line I-I' and section line II-II' in FIG. 1.

FIG. 1 is a top view of a semiconductor structure according to some embodiments of the invention. FIG. 2 is a cross-sectional view of a semiconductor structure taken along section line I-I' and section line II-II' in FIG. 1. In the top view of FIG. 1, some components in the cross-sectional view of FIG. 2 are omitted to clearly illustrate the configuration relationship between the components in FIG. 1.

Referring to FIG. 1 and FIG. 2, a semiconductor structure 10 includes a substrate 100, gate layers 102, channel layers 104, and gate dielectric layers 106. In some embodiments, the substrate 100 may be a silicon substrate or a glass substrate.

The gate layers 102 and the channel layers 104 are stacked on the substrate 100. The gate layers 102 are separated from each other. The gate layer 102 may be a single-layer structure or a multilayer structure. In some embodiments, the materials of the gate layers 102 may include TiN, Al, Ti, Pd, Cr, Cu, Mo, or combinations thereof. In some embodiments, the materials of the channel layers 104 may include oxide semiconductor materials or semiconductor materials. In some embodiments, the oxide semiconductor materials may include InGaZnO (IGZO), InSnO, $In_2O_3$, InZnO, ZnO, GaO, ZnInSnO, or ZnSnO. In some embodiments, the semiconductor materials may include Si, Ge, SiGe, GeSn, GaAs, GaSe, SiC, GaN, InP, AlGaAs, InGaP, or ZnSe.

Each of the gate layers 102 surrounds the corresponding channel layer 104. For example, the gate layer 102A may surround the channel layer 104A, the gate layer 102B may surround the channel layer 104B, and the gate layer 102C may surround the channel layer 104C. Two adjacent gate layers 102 are located between two adjacent channel layers 104. For example, the gate layer 102A and the gate layer 102B may be located between the channel layer 104A and the channel layer 104B, and the gate layer 102B and the gate layer 102C may be located between the channel layer 104B and the channel layer 104C.

In some embodiments, a portion of the lowermost gate layer 102 (e.g., gate layer 102A) may be located between the substrate 100 and the lowermost channel layer 104 (e.g., channel layer 104A). In some embodiments, the length L1 of the channel layer 104A may be greater than the length L2 of the channel layer 104B, and the length L2 of the channel layer 104B may be greater than the length L3 of the channel layer 104C. In addition, the number of the gate layers 102 and the number of the channel layers 104 are not limited to the numbers in the figure. As long as the number of the gate layers 102 and the number of the channel layers 104 are plural, it falls within the scope of the invention.

The gate dielectric layers 106 are located between the gate layers 102 and the channel layers 104. For example, the gate dielectric layer 106A is located between the gate layer 102A and the channel layer 104A, the gate dielectric layer 106B is located between the gate layer 102B and the channel layer 104B, and the gate dielectric layer 106C is located between the gate layer 102C and the channel layer 104C. In some embodiments, the materials of the gate dielectric layers 106 may include high-k dielectric materials. In some embodiments, the high-k dielectric materials may include $Al_2O_3$, $HfO_2$, $TiO_2$, $ZrO_2$, $La_2O_3$, $Y_2O_3$, $Ta_2O_5$, or $HfSiO_4$. In addition, the number of the gate dielectric layers 106 is not limited to the number in the figure. As long as the number of the gate dielectric layers 106 is plural, it falls within the scope of the invention.

In some embodiments, a portion of the lowermost gate dielectric layer 106 (e.g., gate dielectric layer 106A) may be located between the substrate 100 and the lowermost channel layer 104 (e.g., channel layer 104A). In some embodiments, the gate layer 102A and the gate layer 102B may be separated from each other by the gate dielectric layer 106B. In some embodiments, the gate layer 102B and the gate layer 102C may be separated from each other by the gate dielectric layer 106C.

In some embodiments, the semiconductor structure 10 may further include doped regions 108 and doped regions 110. The doped regions 108 and the doped regions 110 are located in the channel layers 104. The doped regions 108 and the doped regions 110 may be located on opposite sides of the gate layers 102. For example, the doped region 108A and the doped region 110A may be located in the channel layer 104A, and the doped region 108A and the doped region 110A may be located on opposite sides of the gate layer 102A. The doped region 108B and the doped region 110B may be located in the channel layer 104B, and the doped region 108B and the doped region 110B may be located on opposite sides of the gate layer 102B. The doped region 108C and the doped region 110C may be located in the channel layer 104C, and the doped region 108C and the doped region 110C may be located on opposite sides of the gate layer 102C.

In some embodiments, the semiconductor structure 10 may further include sacrificial layers 112. The sacrificial layer 112 are located aside the gate layers 102. The sacrificial layer 112 are located between the channel layers 104. For example, the sacrificial layer 112A may be located aside the gate layer 102A. The sacrificial layer 112B may be located aside the gate layer 102A and the gate layer 102B, and the sacrificial layer 112B may be located between the channel layer 104A and the channel layer 104B. The sacrificial layer 112C may be located aside the gate layer 102B and the gate layer 102C, and the sacrificial layer 112C may be located between the channel layer 104B and the channel layer 104C. In some embodiments, the materials of the sacrificial layers 112 are, for example, silicon oxide or silicon nitride. In addition, the number of the sacrificial layers 112 is not limited to the number in the figure. As long as the number of sacrificial layers 112 is plural, it falls within the scope of the invention.

In some embodiments, the semiconductor structure 10 may further include dielectric layers 114. The dielectric layer 114 are located on the gate layers 102. For example, the dielectric layer 114A may be located on the gate layer 102A, the dielectric layer 114B may be located on the gate layer 102B, and the dielectric layer 114C may be located on the gate layer 102C. In some embodiments, a portion of the lowermost dielectric layer 114A may be located in a portion of the lowermost gate layer 102A. In some embodiments, the materials of the dielectric layers 114 are, for example, silicon oxide.

In some embodiments, the semiconductor structure 10 may further include a dielectric layer 116. The dielectric layer 116 is located on the substrate 100, the channel layer 104, and the sacrificial layer 112. The material of the dielectric layer 116 is, for example, silicon oxide.

In some embodiments, the semiconductor structure 10 may further include interconnect structures IS1 to IS9. The interconnect structure IS1, the interconnect structure IS2, and the interconnect structure IS3 may be electrically connected to the gate layer 102A, the gate layer 102B, and the gate layer 102C respectively. The interconnect structure IS4, the interconnect structure IS5, and the interconnect structure IS6 may be electrically connected to the doped region 108A, the doped region 108B, and the doped region 108C respectively. The interconnect structure IS7, the interconnect structure IS8, and the interconnect structure IS9 may be electrically connected to the doped region 110A, the doped region 110B, and the doped region 110C respectively. In some embodiments, the materials of the interconnect structures IS1 to IS9 are, for example, tungsten, copper, titanium, titanium nitride, tantalum, tantalum nitride, or combinations thereof.

In some embodiments, the semiconductor structure 10 may further include transistor devices T1. In some embodiments, the transistor devices T1 may be gate-all-around (GAA) transistor devices. The transistor devices T1 may include the gate layers 102, the channel layers 104, and the gate dielectric layers 106. In some embodiments, the transistor device T1 may further include the doped regions 108 and the doped regions 110. For example, the transistor device T11 may include the gate layer 102A, the channel layer 104A, the gate dielectric layer 106A, the doped region 108A, and the doped region 110A. The transistor device T12 may include the gate layer 102B, the channel layer 104B, the gate dielectric layer 106B, the doped region 108B, and the doped region 110B. The transistor device T13 may include the gate layer 102C, the channel layer 104C, the gate dielectric layer 106C, the doped region 108C, and the doped region 110C.

Based on the above embodiments, in the semiconductor structure 10, the gate layers 102 and the channel layers 104 are stacked on the substrate 100, the gate layers 102 are separated from each other, and each of the gate layers 102 surrounds the corresponding channel layer 104, and two adjacent gate layers 102 are located between two adjacent channel layers 104. Therefore, the semiconductor structure 10 can effectively increase the device density of the semiconductor device (e.g., transistor device T1).

Figure 3:
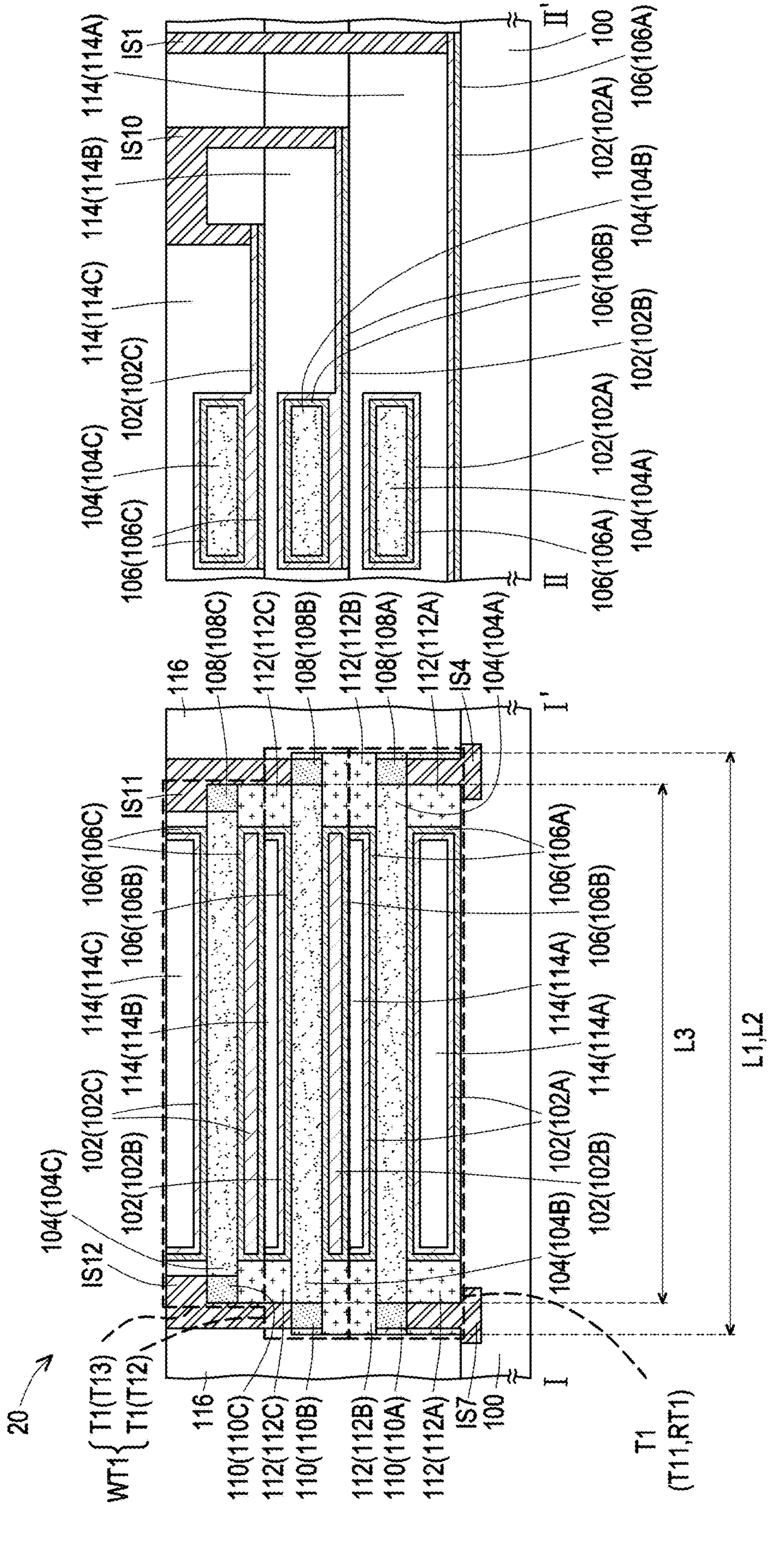
FIG. 3 is a cross-sectional view of a semiconductor structure according to other embodiments of the invention.
Figure 4:
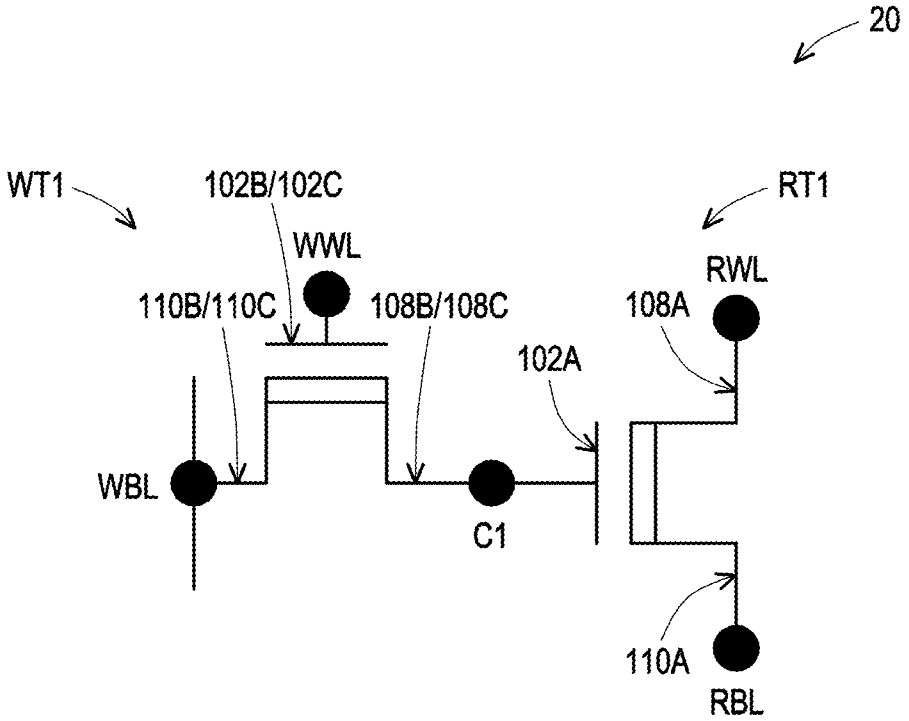
FIG. 4 is a schematic circuit diagram of the semiconductor structure in FIG. 3.

FIG. 3 is a cross-sectional view of a semiconductor structure according to other embodiments of the invention. FIG. 4 is a schematic circuit diagram of the semiconductor structure in FIG. 3.

Referring to FIG. 2, FIG. 3, and FIG. 4, the differences between the semiconductor structure 20 of FIG. 3 and the semiconductor structure 10 of FIG. 2 are as follows. In the semiconductor structure 20, the interconnect structure IS10 is electrically connected to the gate layer 102B and the gate layer 102C, the interconnect structure IS11 is electrically connected to the doped region 108B and the doped region 108C, and the interconnect structure IS12 is electrically connected to the doped region 110B and the doped region 110C. Therefore, two transistor devices T1 (i.e., transistor device T12 and transistor device T13) may be connected in parallel, but the invention is not limited thereto. As long as at least two of the transistor devices T1 may be connected in parallel, it falls within the scope of the invention.

In the semiconductor structure 20, the interconnect structure IS4 and the interconnect structure IS7 may be located in the sacrificial layer 112A and the substrate 100. In addition, in the semiconductor structure 20, the length L1 of the channel layer 104A may be equal to the length L2 of the channel layer 104B, so the device size of the semiconductor device (e.g., transistor device T11) can be further reduced, and the device density of the semiconductor device (e.g., transistor device T1) can be further increased.

In some embodiments, the semiconductor structure 20 may be a 2-transistor-0-capacitor (2T0C) dynamic random access memory (DRAM). The transistor devices T1 may include a write transistor device WT1 and a read transistor device RT1. The write transistor WT1 may include at least two of the transistor devices T1 (e.g., transistor device T12 and transistor device T13) connected in parallel, so the write transistor WT1 can have a larger current. The read transistor device RT1 may be the transistor device T11.

Referring to FIG. 4, the doped region 108B and the doped region 108C of the write transistor WT1 may be electrically connected to the gate layer 102A of the read transistor RT1. The doped region 110B and the doped region 110C of the write transistor WT1 may be electrically connected to the write bit line WBL. The gate layer 102B and the gate layer 102C of the write transistor WT1 may be electrically connected to the write word line WWL. The doped region 108A of the read transistor device RT1 may be electrically connected to the read word line RWL. The doped region 110A of the read transistor device RT1 may be electrically connected to the read bit line RBL. In addition, the capacitor C1 may be a capacitor formed by the gate layer 102A, the gate dielectric layer 106A, and the channel layer 104A.

Furthermore, in FIG. 2 and FIG. 3, the same or similar components are denoted by the same reference symbols, and the description thereof is omitted.

Based on the above embodiments, in the semiconductor structure 20, the gate layers 102 and the channel layers 104 are stacked on the substrate 100, the gate layers 102 are separated from each other, and each of the gate layers 102 surrounds the corresponding channel layer 104, and two adjacent gate layers 102 are located between two adjacent channel layers 104. Therefore, the semiconductor structure 20 can effectively increase the device density of the semiconductor device (e.g., transistor device T1).

In summary, the semiconductor structure of the aforementioned embodiments includes a substrate, gate layers, channel layers, and gate dielectric layers. The gate layers and the channel layers are stacked on the substrate, the gate layers are separated from each other, each of the gate layers surrounds the corresponding channel layer, and two adjacent gate layers are located between two adjacent channel layers. Therefore, the semiconductor structure of the aforementioned embodiments can effectively increase the device density of the semiconductor device (e.g., transistor device).

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:

a substrate;

gate layers and channel layers stacked on the substrate, wherein the gate layers are separated from each other, each of the gate layers surrounds the corresponding channel layer, and two adjacent gate layers are located between two adjacent channel layers;

gate dielectric layers located between the gate layers and the channel layers; and transistor devices, wherein the transistor devices comprise the gate layers, the channel layers, and the gate dielectrics layer, wherein a portion of the lowermost gate layer is located between the substrate and the lowermost channel layer, a portion of the lowermost gate dielectric layer is located between the substrate and the lowermost channel layer, and at least two of the transistor devices are connected in parallel.

2. The semiconductor structure according to claim 1, wherein the substrate comprises a silicon substrate or a glass substrate.

3. The semiconductor structure according to claim 1, wherein materials of the gate layers comprise TiN, Al, Ti, Pd, Cr, Cu, Mo, or combinations thereof.

4. The semiconductor structure according to claim 1, wherein materials of the channel layers comprise oxide semiconductor materials or semiconductor materials.

5. The semiconductor structure according to claim 4, wherein the oxide semiconductor materials comprise InGaZnO, InSnO, $In_2O_3$, InZnO, ZnO, GaO, ZnInSnO, or ZnSnO.

6. The semiconductor structure according to claim 4, wherein the semiconductor materials comprise Si, Ge, SiGe, GeSn, GaAs, GaSe, SiC, GaN, InP, AlGaAs, InGaP, or ZnSe.

7. The semiconductor structure according to claim 1, wherein materials of the gate dielectric layers comprise high dielectric constant dielectric materials.

8. The semiconductor structure according to claim 7, wherein the high dielectric constant dielectric materials comprise $Al_2O_3$, $HfO_2$, $TiO_2$, $ZrO_2$, $La_2O_3$, $Y_2O_3$, $Ta_2O_5$, or $HfSiO_4$.

9. The semiconductor structure according to claim 1, further comprising:

first doped regions and second doped regions located in the channel layers, wherein the first doped regions and the second doped regions are located on opposite sides of the gate layers.

10. The semiconductor structure according to claim 9, wherein the transistor devices further comprise the first doped regions and the second doped regions.

11. The semiconductor structure according to claim 10, wherein the transistor devices comprise a write transistor device and a read transistor device.

12. The semiconductor structure according to claim 11, wherein the write transistor comprises at least two of the transistor devices connected in parallel.

13. The semiconductor structure according to claim 11, wherein the first doped region of the write transistor is electrically connected to the gate layer of the read transistor.

14. The semiconductor structure according to claim 13, wherein a portion of the lowermost dielectric layer is located in a portion of the lowermost gate layer.

15. The semiconductor structure according to claim 1, further comprising:

sacrificial layers located aside the gate layers and located between the channel layers.

16. The semiconductor structure according to claim 1, further comprising:

dielectric layers located on the gate layers.

* * * * *